United States Patent
Yoshida et al.

[19]

[11] Patent Number: 6,113,732
[45] Date of Patent: Sep. 5, 2000

[54] DEPOSITED FILM FORMING APPARATUS

[75] Inventors: Kohei Yoshida, Utsunomiya; Hiroshi Echizen, Nagahama; Masahiro Kanai, Kyoto; Hirokazu Ohtoshi; Takehito Yoshino, both of Nara; Masatoshi Tanaka, Nagahama, all of Japan

[73] Assignee: Canon Kabushiki Kaisha, Tokyo, Japan

[21] Appl. No.: 08/814,081

[22] Filed: Mar. 10, 1997

[30] Foreign Application Priority Data

Mar. 18, 1996 [JP] Japan .................................. 8-088838

[51] Int. Cl.⁷ ...................................................... C23F 1/02
[52] U.S. Cl. ...................... 156/345; 118/723 R; 118/724
[58] Field of Search ........................ 118/723 R, 723 MW, 118/723 ME, 723 MR, 723 MA, 724, 712, 719; 156/345; 204/298.38

[56] References Cited

U.S. PATENT DOCUMENTS

| | | | |
|---|---|---|---|
| 3,926,715 | 12/1975 | Süssmann | 156/612 |
| 4,399,016 | 8/1983 | Tsukada et al. | 204/192 R |
| 5,345,999 | 9/1994 | Hosokawa | 165/80.2 |
| 5,453,125 | 9/1995 | Kruga | 118/723 MR |
| 5,580,822 | 12/1996 | Hayakawa et al. | 437/187 |
| 5,660,740 | 8/1997 | Komino | 216/67 |
| 5,680,428 | 10/1997 | Amemiya et al. | 378/34 |

FOREIGN PATENT DOCUMENTS 60-116784 6/1985 Japan .
63-235478 9/1988 Japan .

*Primary Examiner*—Marian C. Knode
*Assistant Examiner*—Luz Alejandro
*Attorney, Agent, or Firm*—Fitzpatrick, Cella, Harper & Scinto

[57] ABSTRACT

A deposit film forming apparatus is characterized in that a temperature control member for controlling the temperature of a wall of deposition chamber is in contact with an outer wall of a deposition chamber through a heat conductivity adjusting plate, which can prevent overcooling while suppressing an increase in the temperature of the wall of deposition chamber during film formation and which can maintain the temperature of the wall of deposition chamber at a preferable temperature for deposition of film for a long time, thereby forming a deposit film. As a result, the apparatus can mass-produce deposit films of stable quality, especially, large-area and good-quality photovoltaic elements utilizing amorphous semiconductors, over a long period.

10 Claims, 6 Drawing Sheets

DEPOSITED FILM FORMING APPARATUS

BACKGROUND OF THE INVENTION

1. Field of the Invention

The present invention relates to an improvement in a film depositing method and film depositing apparatus for continuously forming large-area, functional deposited films by generating a uniform microwave plasma over a large area and decomposing and exciting raw-material gases by the reaction caused thereby.

More particularly, the present invention concerns a method and apparatus for forming a large-area photovoltaic element utilizing an amorphous semiconductor and, specifically, a means arranged to control a temperature of walls of a deposited film forming chamber, for obtaining a functional deposited film of good quality.

2. Related Background Art

Proposed as one of efficient mass-producing methods of photovoltaic elements is a method for fabricating an amorphous-silicon-based solar battery wherein independent film-forming chambers are provided for forming respective semiconductor layers of a solar battery. The semiconductor layers are formed in each of the corresponding film-forming chambers.

For example, the specification of U.S. Pat. No. 4,400,409 discloses the continuous plasma CVD system employing the roll-to-roll method. This system can continuously form an element having a semiconductor junction in such a way that a plurality of glow discharge regions are. A flexible substrate having a desired width and length is disposed along a path which passes through the respective glow discharge regions. The substrate is continuously conveyed in its longitudinal direction while necessary electroconductive semiconductor layers are deposited in the respective glow discharge regions.

Using microwaves as energy for generating a plasma is known. Since the wavelengths of microwaves are short, the energy density can be enhanced over the conventional cases using RF. Thus microwaves are suitable for efficient generation and continuation of plasma.

For example, U.S. Pat. No. 4,517,223 and U.S. Pat. No. 4,504,518 disclose a method for depositing a thin film on a small-area substrate in a microwave glow discharge plasma under low pressure. This method can obtain a high-quality deposited film and prevent polymerization of active species that could cause degradation of film characteristics. The method can outstandingly improve the deposition rate, because the process is under low pressure.

Further, the specification of U.S. Pat. No. 4,729,314 discloses the low-pressure microwave plasma enhanced CVD process and system for depositing a photoconductive semiconductor thin film on a large-area cylindrical substrate by a high-power process using a pair of radiation waveguide applicators.

Taking the above circumstances into consideration, a mass-producing method of higher throughput can be obtained by combining the microwave plasma enhanced CVD process (hereinafter referred to as "$\mu$W-CVD process") with the roll-to-roll production method said to be suitable for mass production.

Let us consider, an example for fabricating an a-SiGe single-layer cell (single cell) solar battery using an a-SiGe layer for the i-layer (photoelectric conversion layer) by the roll-to-roll $\mu$W plasma enhanced CVD process (hereinafter referred to as "R-R$\mu$WCVD process"), the combination of the two foregoing methods.

A manufacturing apparatus by the R-R$\mu$WCVD process is arranged to continuously deliver a beltlike substrate for formation of film of a-SiGe from a bobbin with a rolled substrate thereon, to form a plurality of layers including at least an n-type a-Si layer, an i-type a-SiGe layer, a p-type a-Si layer, and the like. The solar battery is formed in respective film-forming chambers (which are the same as the foregoing "deposition chambers") each being separate reactors. Connecting members (normally called "gas gates" or simply "gates") allow the substrate to move between the plural film-forming chambers while maintaining a reduced pressure condition in each film-forming space. They also prevent gases supplied to the respective film-forming chambers, for example, raw materials for the n-type a-Si layer, p-type a-Si layer, etc. from diffusing and mixing into each other.

FIG. 8 is a schematic drawing to show an apparatus for fabricating the semiconductor element of a-SiGe solar battery or the like by the R-R$\mu$WCVD process, in which the $\mu$W method is used to make the i-type a-SiGe layer having a large deposited film thickness which is required to be formed at a high throughput. The RF method is used to make the n-type and p-type a-Si layers having a small deposited film thicknesses and is not required to be formed at such a high throughput as compared with the i-type a-SiGe layer.

In FIG. 8, reference numeral 801 designates a beltlike substrate (hereinafter referred to simply as a substrate) for the a-Si layers to be deposited thereon. The substrate 801 is usually a deformable electroconductive substrate, for example, a thin plate of stainless steel, aluminum, or the like, or a member obtained by coating a non-conductive thin plate with a conductive thin film or the like. The substrate 801 is rolled around a circular bobbin 811, which is installed in a feed chamber 810. The substrate 801 sent out from the bobbin installed in the feed chamber 810 passes through gas gate (hereinafter referred to simply as "gate") 820, n-type a-Si film-forming chamber 830, gate 840, i-type a-SiGe film-forming chamber 850, gate 860, p-type a-Si film-forming chamber 870, and gate 880 to be wound up around a winding bobbin 891 installed in a winding chamber 890.

Each of 830a and 870a denotes an RF power supply, and each of 830b and 870b is a cathode electrode for exciting RF discharge, to which power for depositing the n-type a-Si layer or the p-type a-Si layer, respectively, is supplied.

Further, 850a is an applicator comprised of a dielectric window for radiating the microwave into the film-forming space, to which power is applied from a microwave power supply (not shown) through a rectangular waveguide tube 850b set perpendicularly to the dielectric window, thereby causing glow discharge in the discharge space in the i-type a-SiGe film-forming chamber.

Reservoirs 802a to 806a are each filled raw material gas for forming each deposited film, wherein 802a is filled with SiH$_4$ gas, 803a with GeH$_4$ gas, 804a with H$_2$ gas, 805a with PH$_3$ gas, and 806a with BF$_3$ gas.

Each gas is guided through switch valve 802b to 806b and pressure reducing device 802c to 806c to gas mixer 830c, 850c, 870c.

A raw-material gas, adjusted at desired flow rate and mixture ratio in the gas mixer 830c to 870c, passes through gas inlet line 830d, 850d, 870d to flow into each film-forming chamber. The gas introduced into the film-forming chamber is evacuated to achieve the desired pressure in each chamber, by evacuation apparatus 810e, 830e, 850e, 870e, 890e comprised of an oil diffusion pump, a mechanical booster pump, and a rotary pump, or the like, to be guided to an unrepresented exhaust gas processing apparatus. Further, each of 830f, 850f, 870f is a heater for heating the substrate, to which power is supplied from power supply 830g, 850g, 870g, respectively.

Numeral 841 or 861 is a part for adjusting the cross section of the aperture of the gate, which reduces mutual diffusion of gas between the film-forming chambers by narrowing the gas flow path.

Further, a gas that does not negatively affect film formation, for example $H_2$, He, or the like, is supplied through a gas inlet port 842 or 862 to the gate from a gas bomb 807a via a pressure reducing device 807b and a flow-rate adjuster 807c, 807d, thereby further suppressing mutual diffusion of raw-material gas in each film-forming chamber.

The substrate 801 (the "beltlike substrate" will be referred to as "substrate") sent out from the feed chamber 810 successively advances in each film-forming chamber, whereby the n-type a-Si film, i-type a-SiGe film, and p-type a-Si film are formed on the surface thereof, and then the substrate goes finally into the winding chamber 890.

First, the substrate 801 is heated up to a desired temperature by the heater 830f in the n-type a-Si film-forming chamber 830.

The gas mixer 830c mixes gases of $SiH_4$, $H_2$, $PH_3$, and the like being the raw materials for the n-type a-Si film each at an optimum flow rate and the mixture is then introduced to the film-forming chamber 830. At the same time, the RF power is supplied from the RF power supply 830a to the cathode 830b to cause glow discharge in the film-forming space, thereby forming the n-type a-Si film on the surface of substrate 801.

Next, the substrate advances in the gate 840 and then goes into the i-type a-SiGe film-forming chamber 850. In the film-forming chamber 850, similarly as described above, optimum power is supplied to $SiH_4$, $GeH_4$, and $H_2$ gases each set at an optimum flow rate, thereby forming the desired i-type a-SiGe film on the foregoing n-type a-Si film. Then the substrate 801 passes through the gate 860 and p-type a-Si film-forming chamber 870 in the same manner to be wound up around the bobbin 891 in the winding chamber 890.

Since the substrate is successively guided through the n-type, i-type, and p-type film-forming chambers in this way, the fabricating apparatus of the roll-to-roll method can achieve a very high throughput. (Problems of R-R$\mu$WCVD)

(1) The problem with conventional R-R$\mu$WCVD process is that the input microwave power is not used only for decomposition of raw-material gas for deposition of film, but the microwave power also indirectly heats the walls of the deposition chamber forming the film-forming space through the high plasma density or the microwave itself directly heats the walls to high temperatures.

The temperature of the walls of deposition chamber starts increasing at the same time as the input of microwave power and, after a while, reaches a saturation temperature determined by the discharge power value or the like at that time. The temperature may reach 300° C. or even about 450° C. depending upon the conditions.

The first resulting problem is that the temperature of the beltlike substrate increases as affected by the high temperature of the walls of deposition chamber, so that the substrate temperature cannot be maintained around 300° C., which is normally considered to form a deposition film with good quality.

Solar batteries fabricated under such circumstances will have low photoelectric conversion efficiency.

(2) Depending upon the material for the walls of the deposition chamber, the temperature could reach near the softening point thereof, thus damaging the walls of film-forming chamber.

Specifically, for example, when aluminum is used for the walls of the film-forming chamber, temperatures near 450° C. will deform screwing portions, portions under tensile stress, etc. to make them of no use.

In order to prevent such an accident, a high-melting-point material should be selected or a cooling means for preventing the increase of temperature in the walls of deposition chamber needs to be provided.

From the two problems described above, cooling of the walls of deposition chamber is necessitated as a significant technical subject in using the microwave discharge.
(Prior art about control of temperature of deposition chamber)

Japanese Patent Application Laid-open No. 1-36085 discloses a dry process apparatus for performing etching or deposition, provided with a cooling means for cooling the wall surfaces of deposition chamber (process chamber). It describes use of microwaves as a gas decomposing means. Further, it describes an improvement in cooling efficiency of the wall surfaces of process chamber by enclosing the process chamber in a vacuum vessel.

The above prior art, however, employs cooling of the process chamber walls for the purpose of preventing impurities deposited on the internal walls of the process chamber or the material forming the internal walls of process chamber from drifting away, and liquid nitrogen is listed as an example of a cooling agent. As apparent from this, there is nothing described about the problem of overcooling of the deposition chamber.

Japanese Patent Application Laid-open No. 60-24377 a lso discloses preventing degradation of film quality due to release gas by cooling the electrode and the internal walls of deposition chamber. It describes water, liquid nitrogen, and Freon as a cooling agent.

The prior art, however, describes that the temperature of the internal walls of a deposition chamber is desirably maintained at a temperature of not more than 150° C., does not recognize the problem of overcooling, and describes nothing about maintaining the temperature of substrate around 300° C. which usually forms a deposited film of good quality by $\mu$W-CVD. When a deposited film is formed, especially on an elongated beltlike substrate as in the present invention, it is important to maintain the temperature of the substrate at a preferred value for a long time.

The walls of deposition chamber are held in the outer chamber for maintaining the pressure-reduced state as described above, and a cooling means under such reduced pressure is demanded.

The cooling means is conceivably one utilizing heat radiation.

This is a method for providing the deposition chamber and outer chamber with a plurality of heat radiation fins comprised of a plurality of blades disposed in an alternating arrangement and for cooling the walls of deposition chamber by mutual heat radiation and absorption between the fins. However, the cooling by heat radiation is low in cooling efficiency and is effective in low power, but does not achieve the effect as expected, in large power.

In consideration of the foregoing, we have repeated investigation on a method for utilizing heat conduction as a means for further raising the cooling efficiency.

This is a method for cooling the walls of deposition chamber by drawing a water-cooling pipe or the like into the outer chamber as vacuum-sealing it and keeping it in contact with the walls of deposition chamber.

As a result of our extensive and intensive investigation, it was found that good results could be achieved by maintaining the temperature of the walls of deposition chamber in the range of 100° C. to 350° C., preferably in the range of 150° C. to 300° C., while cooling the deposition walls.

The first reason is that temperatures of the walls of deposition chamber over 350° C. will increase the temperature of the beltlike substrate as described above, to degrade the characteristics of a resulting solar battery.

The second reason is that temperatures of the walls of deposition chamber below 100° C. will cause a phenomenon that it becomes difficult to maintain the microwave discharge, though the reason is indefinite.

On the other hand, it revealed another problem.

Since the cooling is direct cooling utilizing heat conduction, the cooling efficiency is too high, and it is not easy to maintain the temperature of the walls of deposition chamber in the range 150° C. to 300° C. for a long time, which decreases the temperature of the walls of deposition chamber. As a result, discharge is frequently interrupted as described above. If the amount of cooling water is reduced in order to raise the temperature of the walls of the deposition chamber, the cooling water will sometimes exceed the boiling point thereof to cause sudden volume expansion, which will break the water-cooling pipe.

This breakage of the water-cooling pipe would damage accessory parts, particularly, the vacuum pump or heaters, because of sudden flow of vapor into the vacuum vessel, or it would cause a dangerous accident such as gushing of hot water into the atmosphere.

From the above, a sufficient amount of water needs to flow so as to keep the temperature of cooling water below 100° C. and the walls of deposition chamber need to be maintained at temperatures in the range of 150° C. to 350° C. as preventing overcooling thereof.

Moreover, consideration is necessitated not only on the cooling mechanism of the walls of the deposition chamber as described, but also on a heating mechanism.

(About baking)

At a degassing step, called baking, it is necessary to raise the temperature of the walls of the deposition chamber without help of discharge energy.

The temperature upon such baking is determined depending upon various factors including baking time, the wall material, desired film quality, and so on, but it is usually 100 or more °C. and preferably not much lower than the temperature of the wall upon film formation.

Since the film-forming step is usually started after the baking step, it is desired to maintain the baking temperature closer to the temperature upon film formation from the aspect of stability of the temperature and characteristics in the initial stage of the film-forming step, and a sufficient temperature-raising mechanism is necessary.

It is, therefore, an object of the present invention to provide a film depositing method and film depositing apparatus using the microwave plasma enhanced CVD process that can mass-produce deposited films of stable quality over a long period by restraining temperature increases at the walls of deposition chamber forming the film-forming space, and by maintaining the temperature in the preferred range for deposition of film, thus solving the above problems in the prior art.

SUMMARY OF THE INVENTION

A deposited film forming apparatus is characterized in that a temperature control member for controlling the temperature of walls of the deposition chamber is in contact with an outer wall of a deposition chamber through a heat conductivity adjusting plate, which can prevent overcooling while also suppressing the temperature increase of the walls of the deposition chamber during film formation. It can also maintain the temperature of the walls of the deposition chamber at a preferable temperature for film deposition for a long time, thereby forming a deposited film. As a result, the apparatus can mass-produce deposited films of consistent quality, especially, large-area and good-quality photovoltaic elements utilizing amorphous semiconductors, over a long period.

DETAILED DESCRIPTION OF THE PREFERRED EMBODIMENTS

Figure 1:
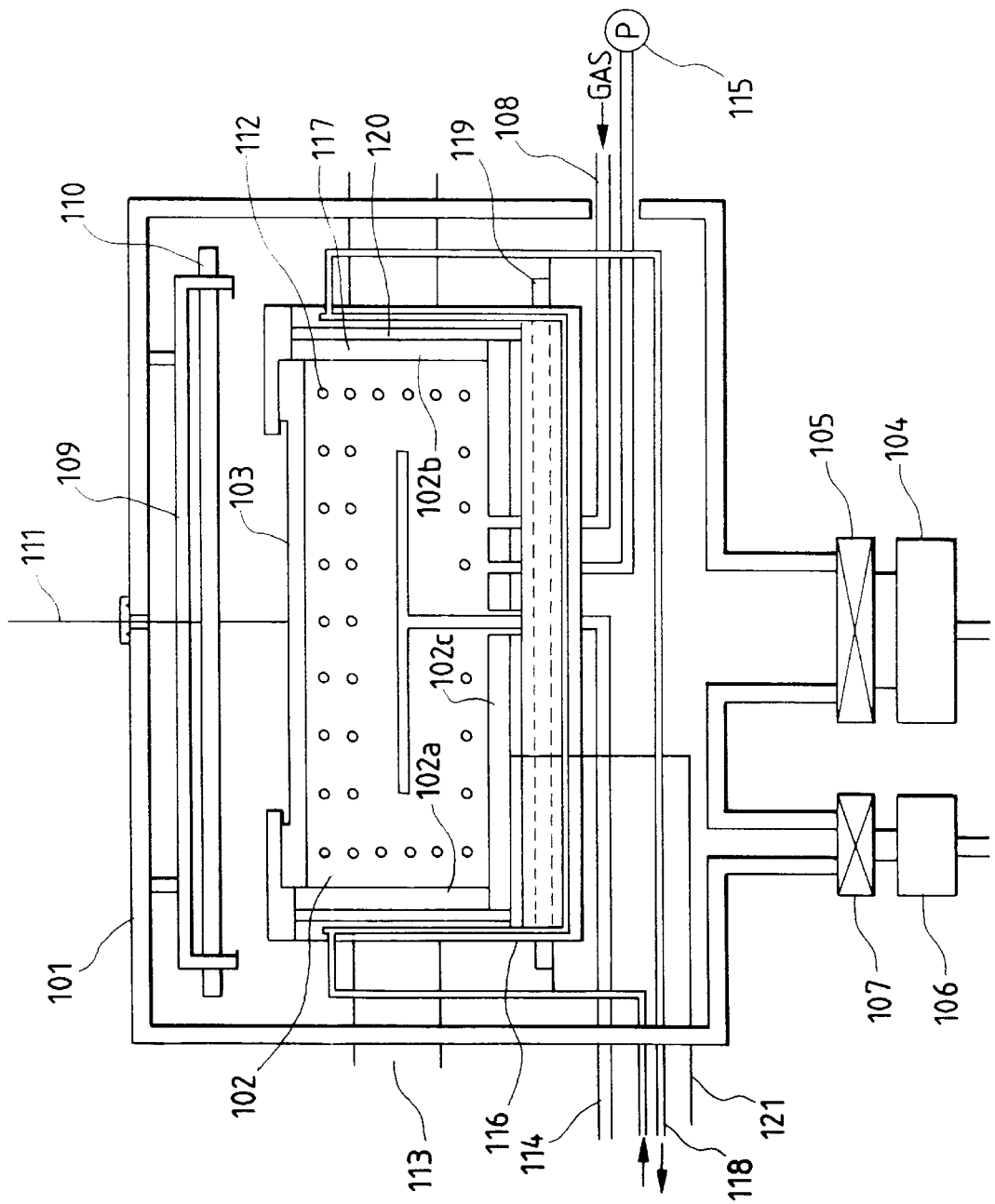
FIG. 1 is a schematic drawing to show a film-forming chamber and a vacuum chamber utilizing the microwave, constituting a roll-to-roll film-forming apparatus of the present invention.

FIG. 1 is a schematic drawing to show an apparatus for carrying out the method for cooling the film depositing chamber according to the present invention, in a microwave film-forming chamber of the R-R$\mu$WCVD process.

In FIG. 1, reference numeral 101 designates an outer chamber for creating a reduced pressure state. Numeral 102 denotes a deposition chamber for exciting discharge in an inner space thereof and for carrying out deposition of film therein.

Characters 102a, 102b are applicator surfaces a part of which has an applicator means forming the deposition chamber.

Character 102c is a normal wall surface forming the deposition chamber.

Numeral 103 represents a beltlike substrate, which is conveyed by a conveying mechanism (not shown) to pass in the deposition chamber, and the surface of the beltlike substrate forms the deposition chamber.

Numeral 104 is a vacuum evacuation pump. The vacuum pump 104 is, for example, an oil diffusion pump, a turbo molecular pump, or the like and this pump purges the consumption gas upon deposition of film.

Numeral 105 denotes a valve for permitting variable adjustment of evacuation rate and for adjusting the pressure inside the outer chamber or closing the outer chamber.

Numeral 106 is a so-called roughing vacuum pump, which reduces the pressure inside the outer chamber by opening a valve 107 when the pressure inside the outer chamber 101 is the atmospheric pressure.

Numeral 108 stands for a gas inlet pipe, and the raw-material gases and the like for formation of a deposited film are supplied from a mass flow controller or the like as described in the prior art and guided through the gas inlet pipe into the film deposition chamber 102.

Numeral 109 denotes a lamp heater house incorporating an infrared lamp heater 110 for heating the substrate up to a desired temperature thereof upon film formation and maintaining it at the temperature while the beltlike substrate 103 is conveyed. The temperature for heating and maintaining the substrate thereat is monitored and controlled by a temperature sensor 111, for example, a thermocouple or the like. Numeral 112 is an exhaust surface constituting the film deposition chamber, for evacuating the consumption gas, which has such a structure as to confine the microwave introduced through a microwave inlet pipe 113 into the deposition chamber and to have small holes or small slits, for example, such as a punching metal, a louver, or an expanded metal, to evacuate the raw-material gases for deposition of film introduced into the deposition chamber or the consumed gas thereof.

Numeral 114 designates a bias electrode for control of discharge, which is used to control the quality of the deposited film or the like, by supplying a plasma generated in the film deposition chamber by the microwave a potential of direct current (DC), low frequency (LF), or radio frequency (RF) from a power supply (not shown).

Numeral 115 is a pressure meter used for monitoring and controlling the inner pressure inside the deposition chamber.

Numeral 116 is a temperature control member attached to the outside of the applicator surfaces 102a, 102b and normal wall surface 102c constituting the film deposition chamber 102, which comprises a cooling agent circulation path 118 and a lamp heater 119 inside thereof.

(Heat conductivity adjusting plate)

Numeral 120 is an adjusting plate (heat conductivity adjusting plate) for adjusting mutual heat conduction between the temperature of the walls 117 of the deposition chamber and the temperature of the temperature control member 116, which enables an appropriate temperature difference to be generated between the walls of deposition chamber and the temperature control member.

Namely, the adjusting plate 120 is for preventing the walls of the deposition chamber from being overcooled and for keeping the cooling agent such as water inside the temperature control member 116 below the boiling point thereof.

As for the shape, the contact area with the walls of the deposition chamber is controlled in order to adjust the heat conductivity. Examples thereof include mirror finish, drilling process (FIG. 3), and knurling process (FIG. 4).

The material for the adjusting plate is one having high heat conductivity, for example, aluminum or aluminum alloy or the like.

A plurality of heat conductivity adjusting plates having different contact areas are prepared and are properly changed one from another, depending upon a setting temperature of the deposition chamber. Numeral 121 represents a temperature sensor.

(Temperature control member)

Figure 2:
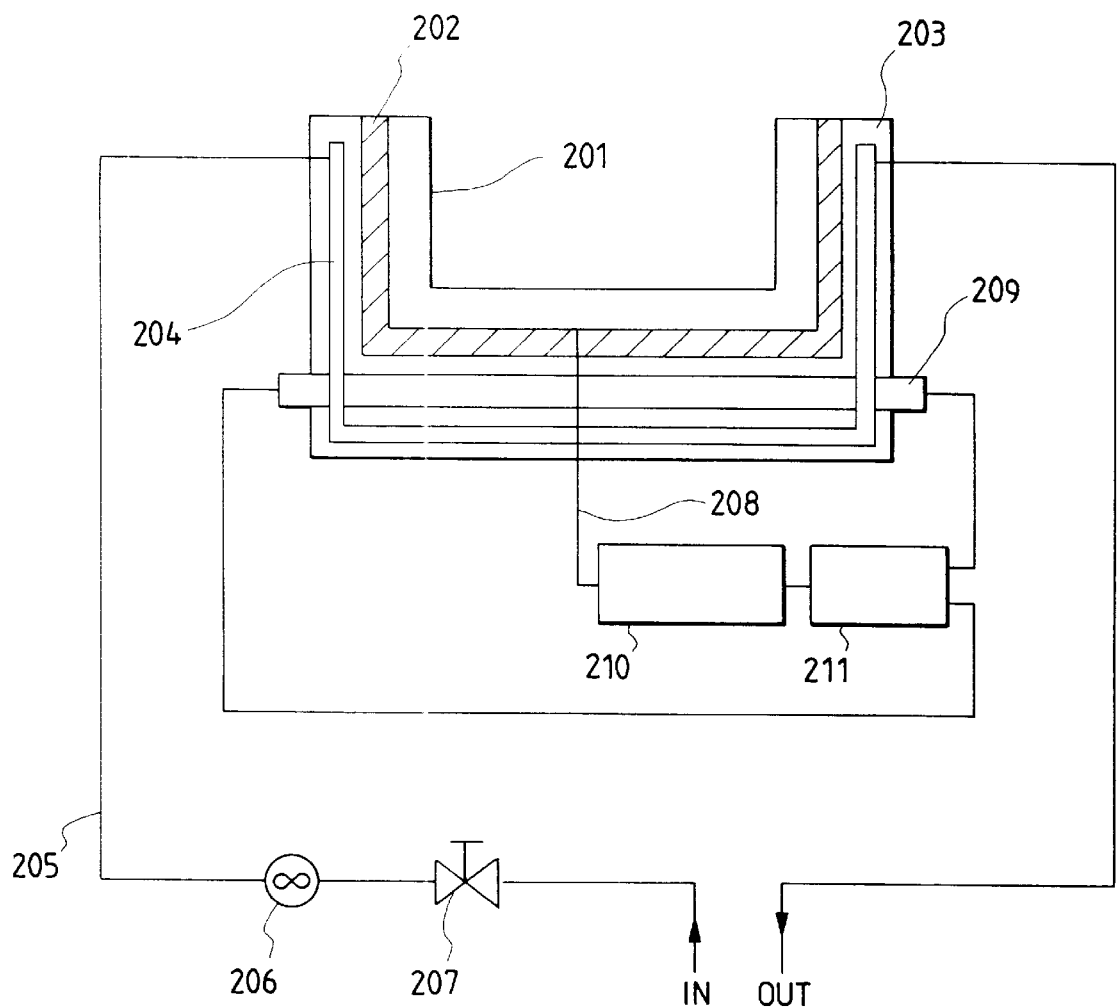
FIG. 2 is a block diagram to show a state of a temperature-control jacket.

FIG. 2 is a schematic drawing of the temperature control member in control of temperature of the walls of deposition chamber.

The cooling agent is controlled at a constant flow rate determined by a flow-rate adjusting valve 207 through a cooling agent pipe 205 and passes through a circulation path 204 inside the temperature control member 203. Numeral 206 represents a flow meter.

On the other hand, a lamp heater 209 is used for preheating and baking the deposition chamber up to a desired temperature before start of formation of film. A temperature controller 210 determines an on rate of lamp heater 209 in real time and, based thereon, turns on the lamp heater 209 so that the temperature of the deposition chamber wall 201 measured by a temperature sensor 208 becomes a desired control temperature. Numeral 211 represents a power source.

Further, the cooling agent and lamp heater may be used simultaneously. Namely, the cooling agent always circulates in the temperature control member 203 while the lamp heater 209 changes its on rate in real time, thereby determining the heat capacity of the temperature control member 203, and the heat conductivity adjusting plate 202 described above further adjusts mutual heat conduction between the wall of deposition chamber and the temperature control member 203, thereby maintaining the temperature of the deposition chamber wall 201 at a preferred temperature.

(Procedures of formation of deposited film)

Next described are procedures in carrying out the present invention, using the apparatus shown in FIG. 1.

Since the procedures are the same as in the prior art except that the chamber shown in FIG. 1 replaces the i-type a-SiGe film-forming chamber 850 of the R-R$\mu$ wave CVD system in the prior art and that the control of the temperature of the wall of the deposition chamber, which is a feature of the present invention, is carried out, detailed description of redundant portions will be omitted.

(1) After the beltlike substrate 103 is set, the pressure reducing operation is first started.

Specifically, the roughing pump 106 is actuated to decrease the pressure inside the outer chamber 101 down to a substantial vacuum of about 0.1 mTorr.

Next, evacuation is switched to the main evacuation pump 104 to raise the vacuum degree to a substantial vacuum of approximately $10^{-4}$ Torr.

(2) Next carried out is heating and baking of the beltlike substrate 103 and the walls of the deposition chamber.

First, the gas of He, $H_2$, or the like is guided through the guide inlet pipe 108 into the deposition chamber 102 adjusted at an appropriate flow rate by a gas flow-rate controller (not shown). The gas thus introduced into the deposition chamber 102 flows into the outer chamber through the holes of punching metal, louver, expanded metal, or the like forming the deposition chamber wall 131, and the gas is then evacuated by the vacuum pump 104.

The pressure inside the deposition chamber can be adjusted to a desired pressure by controlling the valve travel of the valve 107 as observing the pressure meter 115.

The pressure is preferably one near the pressure for carrying out microwave film deposition, specifically 1 to 30 mTorr approximately.

The beltlike substrate is heated by the lamp heater 109 up to the temperature normally considered to be preferable for deposition of a-Si film, while the temperature is monitored by the temperature sensor 111.

The deposition chamber walls are heated by the lamp heater 119 provided inside the temperature control member 116 so that the deposition chamber walls may reach the foregoing preferred temperature on the temperature sensor 121.

At this time, the cooling agent also circulates simultaneously inside the temperature control member 116, and the lamp heater 119 is one capable of controlling its output by the on rate thereof, which is controlled at high output when the temperature of deposition chamber wall is lower than the aforementioned preferable temperature but at low output when it is higher, whereby the temperature of deposition chamber wall is maintained at the aforementioned preferable temperature and the cooling agent circulates at temperatures below the boiling point thereof. The system is made to stand in this state for a while to wait for completion of baking inside the system.

After completion of heating and baking, the film-forming step is then started.

(3) For starting film formation, the gas introduced into the deposition chamber 102 is first changed over to the raw-material gases for formation of deposited films, such as $SiH_4$, $GeH_4$, and $H_2$.

After changeover of gas, the evacuation valve 105 is again adjusted to achieve a desired pressure inside the deposition chamber 102.

After that, the microwave is input from a microwave power supply (not shown) through the microwave inlet pipe 113, an isolator (not shown), and a power meter window into the deposition chamber 102 to excite microwave discharge.

After the microwave discharge is excited, the potential for controlling the quality of film, for example, of DC (direct current), LF (low frequency), or RF (radio frequency) is applied from a power supply (not shown) to the bias electrode 114.

At this time, the microwave discharge acts to increase the temperature of the deposition chamber wall, but a temperature rise is prevented by circulation of the cooling agent in the temperature control member 116 as described above. Since the temperature control member is in contact with the deposition chamber walls through the heat conductivity adjusting plate, the cooling agent can be prevented from overcooling the deposition chamber walls. In this way the temperature of the deposition chamber wall is maintained at the preferred temperature. The lamp heater 119 can also be used with suitable control of the on rate at the same time as circulation of the cooling agent during deposition.

In this state a beltlike substrate carrying means (not shown) starts carrying the beltlike substrate, thereby starting continuous deposition of film on the substrate.

At this time, of course, as described with the prior art, the films forming the respective layers of solar battery such as the n-type a-Si film and p-type a-Si film are continuously formed in the adjacent chambers, thereby continuously forming the solar battery on the beltlike substrate.

EXAMPLES

The examples of the present invention will be described hereinafter, but it is noted that the present invention is by no means intended to be limited to these examples.

Example 1

Figure 7:
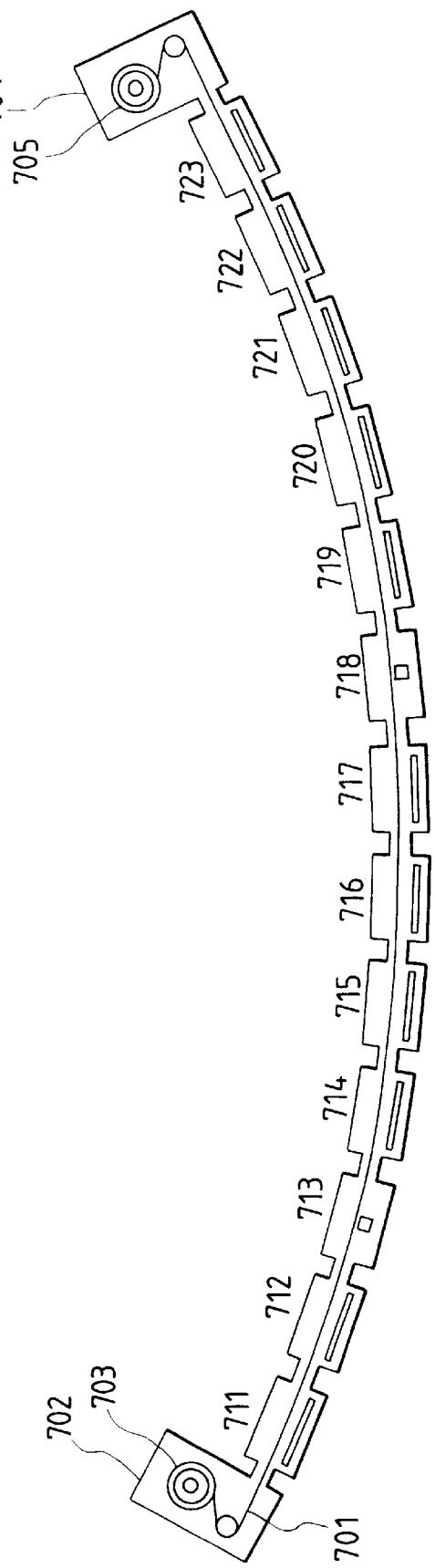
FIG. 7 is a schematic drawing to show a roll-to-roll triple-cell film-forming apparatus according to the present invention.
Figure 8:
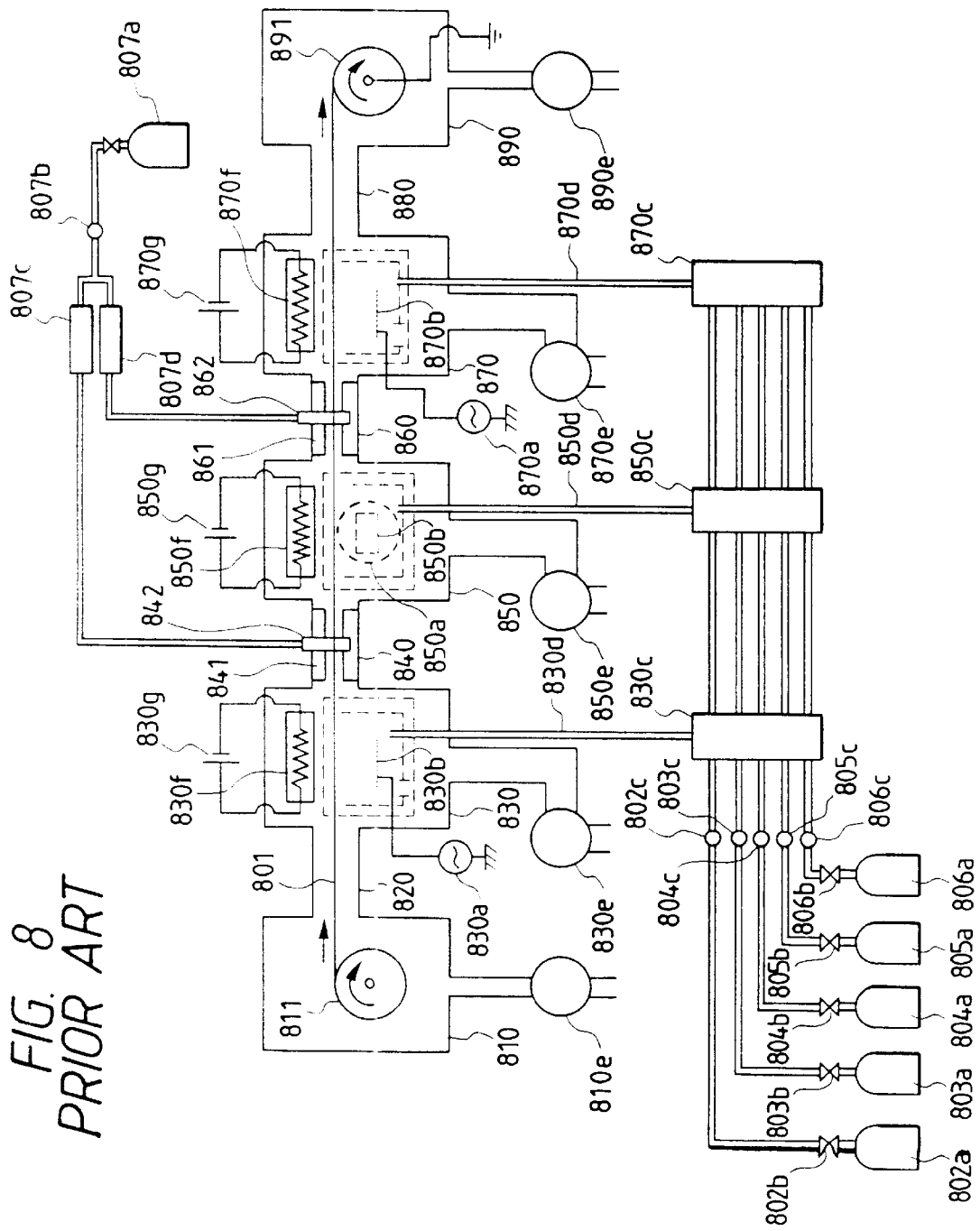
FIG. 8 is a schematic drawing to show the conventional roll-to-roll film-forming apparatus.

FIG. 7 shows the structure of a system for fabricating an a-SiGe triple-cell solar battery using the a-SiGe layer as an i-layer, utilizing a roll-to-roll film-forming apparatus in Example 1 of the present invention.

The structure of solar battery employs a-SiGe prepared by the microwave process for the bottom cell, a-SiGe prepared by the microwave process for the middle cell, a photoelectric conversion layer of a-Si prepared by the RF process for the top cell, and the other layers all prepared by the RF process, and FIG. 7 shows a typical example thereof.

In FIG. 7, numeral 701 designates the beltlike substrate. The beltlike substrate is of SUS 430 having the width of 350 mm and the thickness of 0.15 mm, which is already cleaned and subjected to a ground process in preceding steps. The ground process specifically includes coating of metal or the like for enhancing the light utilization factor by increase of reflection, and the details thereof are described in Table 1.

The beltlike substrate thus prepared is sent out from the feed bobbin 703 set in the feed chamber 702 to each film-forming chamber.

After completion of film formation through all the film-forming chambers, the substrate is wound up around the winding bobbin 705 set in the winding chamber 704.

Numerals 711 to 723 are vacuum chambers each having a film-forming chamber inside thereof, and all the chambers, together with the feed chamber 702 and the winding chamber 704, are connected through gas gates for permitting passage of the beltlike substrate as illustrated.

With the increase in the number of chambers, thus increasing the total length of apparatus, hanging of the beltlike substrate starts to sag due to the gravity and therefore, all the chambers are preliminarily set in a catenary arrangement.

The following film-forming chambers are provided in the respective chambers.

Namely, provided in the chambers are the film-forming chambers including RF film-forming chamber 711 for forming an n-layer at the bottom cell, RF film-forming chamber 712 for forming an ni-anti-diffusion layer of the bottom cell, microwave film-forming chamber 713 for forming an i-layer of the bottom cell, RF film-forming chamber 714 for forming an ip-anti-diffusion layer of the bottom cell, RF film-forming chamber 715 for forming a p-layer of the bottom cell, RF film-forming chamber 716 for forming an n-layer of the middle cell, RF film-forming chamber 717 for forming an ni-anti-diffusion layer of the middle cell, microwave film-forming chamber 718 for forming an i-layer of the middle cell, RF film-forming chamber 719 for forming an ip-anti-diffusion layer of the middle cell, RF film-forming chamber 720 for forming a p-layer of the middle cell, RF film-forming chamber 721 for forming an n-layer of the top cell, RF film-forming chamber 722 for forming an i-layer of the top cell, and RF film-forming chamber 723 for forming a p-layer of the top cell.

The temperature control member was made by forming a trench to become a flow path of the cooling agent (water) and a trench for accommodating the heater in a surface of stainless steel in the U-shaped cross section and welding a stainless steel plate onto the U-shaped stainless steel. This was positioned so as to surround the outside of the deposition chamber walls as shown in FIG. 1. The flow rate of the cooling water inside the temperature control member was set to 1.2 l/min.

Figure 3:
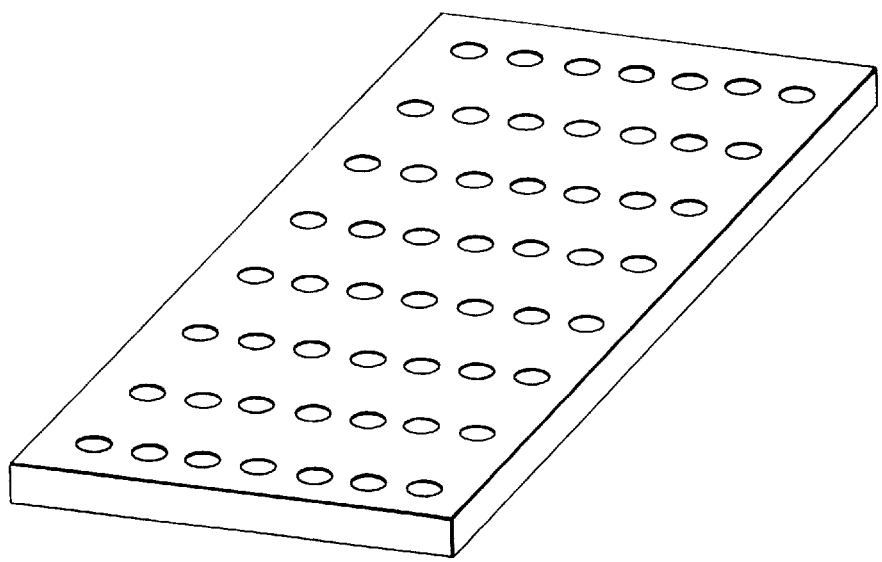
FIG. 3 is a schematic drawing of an adjusting plate used in Example 1, for controlling mutual heat conduction between the temperature of the walls of the deposition chamber and the temperature of a temperature control member according to the present invention.
Figure 4:
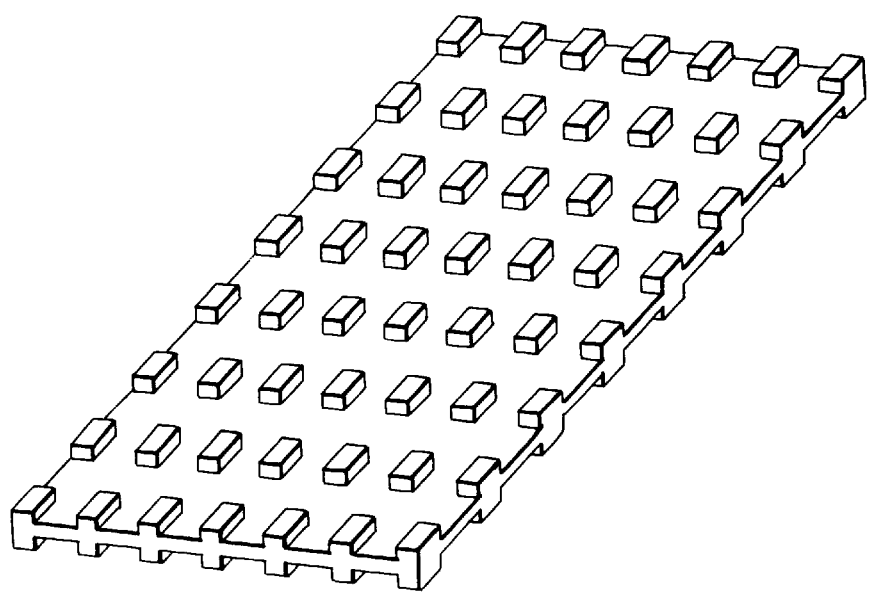
FIG. 4 is a schematic drawing of another adjusting plate used in Example 2, for controlling mutual heat conduction between the temperature of the walls of the deposition chamber and the temperature of the temperature control member according to the present invention.

The shape of the heat conductivity adjusting plate disposed as sandwiched between the film deposition chamber and the temperature control member was one obtained by the drilling process at the area ratio of film deposition chamber wall of 50% as shown in FIG. 3 and then by a blasting process, and one heat conductivity adjusting plate of aluminum (A5052P) 6 mm thick was used.

The temperature control member, heat conductivity adjusting plate, deposition chamber, and walls were fastened together in close contact by bolts.

Since the specific means for fabricating the triple-cell solar battery were already described in the sections of the prior art and structure, the description thereof is omitted herein.

The detailed film-forming conditions thereof are shown in Table 1. In Table 1 "semi layer" means "semiconductor layer" and "dil" means "dilution".

Figure 5:
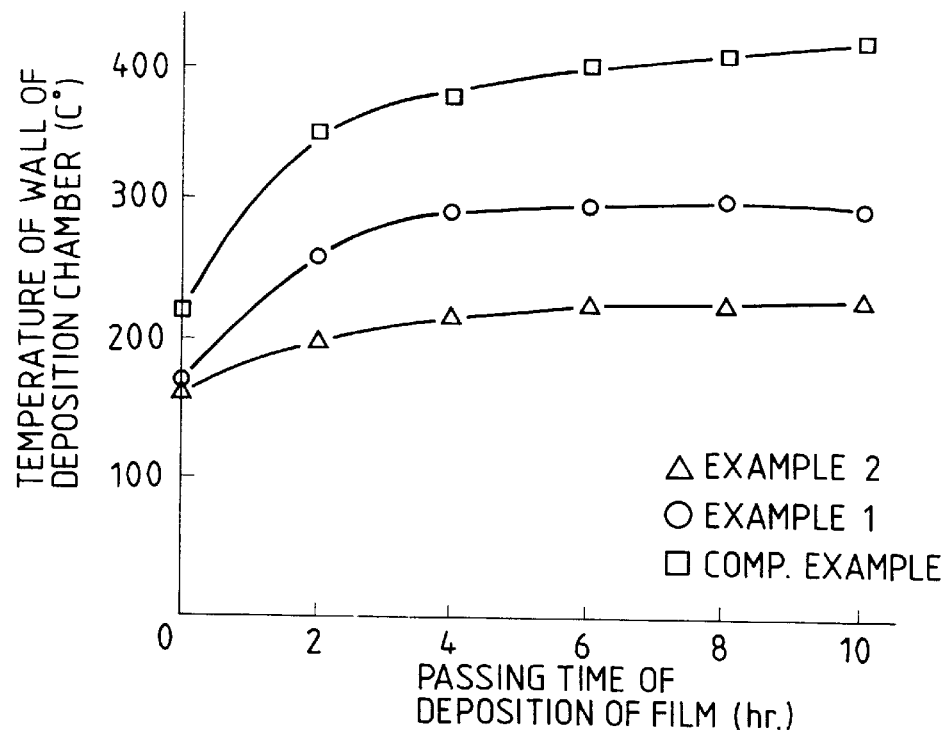
FIG. 5 is a graph to show the relationship of the temperature of the wall of the deposition chamber versus film deposition time.
Figure 6:
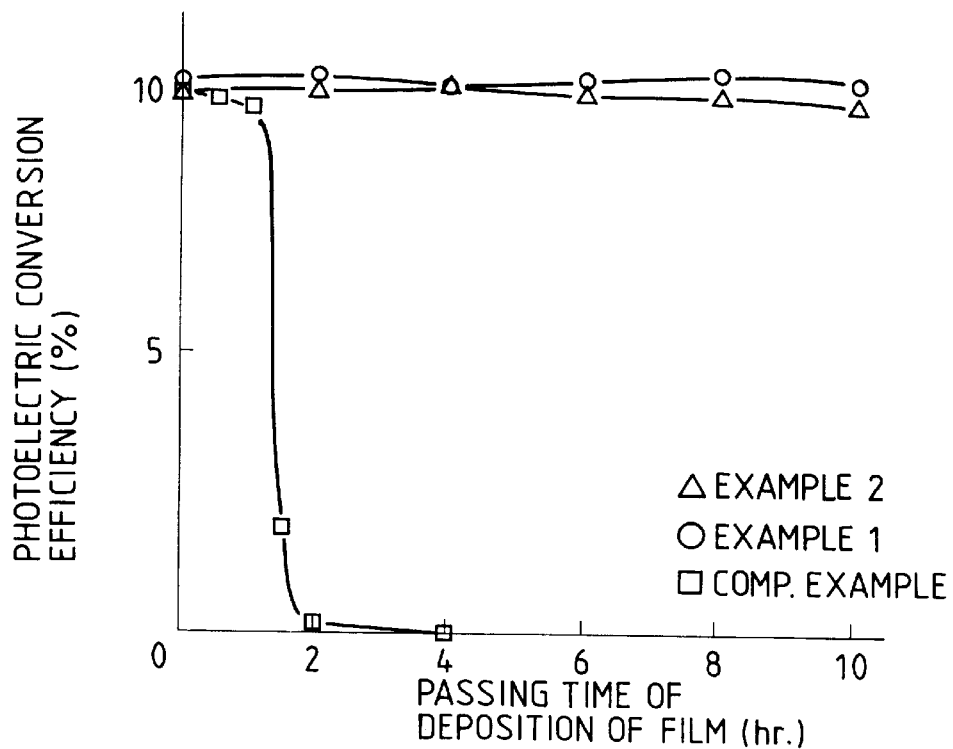
FIG. 6 is a graph to show the relationship of photoelectric conversion efficiency versus film deposition time.

Results of measurement of time changes in the temperature of deposition chamber wall and in the photoelectric conversion efficiency of the triple-cell solar battery are shown by circular marks in FIG. 5 and in FIG. 6, respectively.

It is seen from FIG. 5 and FIG. 6 that the temperature of deposition chamber wall is stable at 290° C. while the photoelectric conversion efficiency remains at 10% for a long time.

(Comparative Example)

In the comparative example, the triple-cell solar battery was fabricated in the same manner as in Example 1 except for exclusion of cooling of the deposition chamber walls, specifically, in such a state that the cooling water was removed without being circulated, using the roll-to-roll film-forming apparatus of the present invention.

Results of measurement of time changes in the temperature of film deposition wall and in the photoelectric conversion efficiency of the triple-cell solar battery are shown by square marks in FIG. 5 and in FIG. 6, respectively.

It is seen from FIG. 5 and FIG. 6 that the temperature of deposition chamber wall increases over the foregoing preferred temperature and that the photoelectric conversion efficiency is also degraded suddenly.

Example 2

In Example 2, the triple-cell solar battery was fabricated in the same manner as in Example 1, using one heat conductivity adjusting plate of Al (A5052P) both surfaces of which were processed by a knurling process at the area ratio of film deposition chamber wall of 9% as shown in FIG. 4 and then by the blasting process.

Film-forming conditions are shown in Table 2. In Table 2, "semi layer" means "semiconductor layer" and "dil" means "dilution".

Results of measurement of time changes in the temperature of film deposition chamber wall and in the photoelectric conversion efficiency of the triple-cell solar battery are shown by triangular marks in FIG. 5 and in FIG. 6, respectively.

It is seen from FIG. 5 and FIG. 6 that the temperature of deposition chamber wall is stable at 220° C. and the photoelectric conversion efficiency at 10% for a long time.

TABLE 1

| Substrate | SUS 430BA width 350 mm thickness 0.127 mm |
| Reflecting layer | Silver (Ag) thin film 100 nm |
| Reflection enhancing layer | Zinc oxide (ZnO) thin film 1 μm |
| Gate gas | $H_2$ from each gate 1000 cc/min |

| Name of layer | | flow rate of gas (cc/min) | discharge power (W) | pressure (Torr) | Temp. of Substrate (° C.) |
|---|---|---|---|---|---|
| Forming conditions of each layer | n-semi layer | $SiH_4$ 100<br>$PH_3/H_2$ (1% dil) 500<br>$H_2$ 700 | 100 (RF) | 1.0 | 290 |
| | n/i anti-diffuse semi layer | $SiH_4$ 50<br>$H_2$ 1000 | 50 (RF) | 1.1 | 270 |
| | i-semi layer | $SiH_4$ 50<br>$GeH_4$ 50<br>$H_2$ 300 | 130 (μW) | 0.02 | 310 |
| | p/i anti-diffuse semi layer | $SiH_4$ 20<br>$GeH_4$ 7<br>$H_2$ 1000 | 50 (RF) | 1.1 | 280 |
| | p-semi layer | $SiH_4$ 100<br>$BF_3/H_2$ (1% dil) 50<br>$H_2$ 1500 | 1000 (RF) | 1.0 | 175 |
| | n-semi layer | $SiH_4$ 50<br>$PH_3/H_2$ (1% dil) 500<br>$H_2$ 1000 | 50 (RF) | 1.0 | 270 |
| | n/i anti-diffuse semi layer | $SiH_4$ 50<br>$H_2$ 1000 | 50 (RF) | 1.1 | 250 |
| | i-semi layer | $SiH_4$ 45<br>$GeH_4$ 40<br>$H_2$ 300 | 130 (μW) | 0.015 | 290 |
| | p/i anti-diffuse semi layer | $SiH_4$ 20<br>$GeH_4$ 5<br>$H_2$ 1000 | 50 (RF) | 1.1 | 280 |
| | p-semi layer | $SiH_4$ 100<br>$PH_3/H_2$ (1% dil) 500<br>$H_2$ 1500 | 1000 (RF) | 1.0 | 175 |
| | n-semi layer | $SiH_4$ 100<br>$PH_3/H_2$ (1% dil) 120<br>$H_2$ 1500 | 80 (RF) | 1.0 | 270 |
| | i-semi layer | $SiH_4$ 150<br>$H_2$ 1000 | 400 (RF) | 1.1 | 200 |
| | p-semi layer | $SiH_4$ 10<br>$BF_3/H_2$ (1% dil) 50<br>$H_2$ 2500 | 1000 (RF) | 1.0 | 175 |
| Transparent electrode | ITO($In_2$ + $SnO_2$) thin film 100 nm | | | | |
| Collector electrode | aluminum (Al) thin film 2 μm | | | | |

TABLE 2

| Substrate | SUS 430BA width 350 mm thickness 0.127 mm |
| Reflecting layer | Silver (Ag) thin film 100 nm |
| Reflection enhancing layer | Zinc oxide (ZnO) thin film 1 μm |
| Gate gas | $H_2$ from each gate 500 cc/min |

| Name of layer | | flow rate of gas (cc/min) | discharge power (W) | pressure (Torr) | Temp. of Substrate (° C.) |
|---|---|---|---|---|---|
| Forming conditions of each layer | n-semi layer | $SiH_4$ 100<br>$PH_3/H_2$ (1% dil) 500<br>$H_2$ 700 | 100 (RF) | 1.0 | 270 |
| | n/i anti-diffuse semi layer | $SiH_4$ 50<br>$H_2$ 1000 | 50 (RF) | 1.1 | 300 |
| | i-semi layer | $SiH_4$ 50<br>$GeH_4$ 50<br>$H_2$ 200 | 200 (μW) | 0.02 | 360 |
| | p/i anti- | $SiH_4$ 20<br>$GeH_4$ 7 | 50 (RF) | 1.1 | 280 |

TABLE 2-continued

| Layer | Gases (sccm) | Power | Pressure | Temp |
|---|---|---|---|---|
| diffuse semi layer | H₂ 900 | | | |
| p-semi layer | SiH₄ 100, BF₃/H₂ (1% dil) 50, H₂ 700 | 1000 (RF) | 1.0 | 150 |
| n-semi layer | SiH₄ 50, PH₃/H₂ (1% dil) 500, H₂ 1000 | 50 (RF) | 1.0 | 220 |
| n/i anti-diffuse semi layer | SiH₄ 50, H₂ 1000 | 50 (RF) | 1.1 | 290 |
| i-semi layer | SiH₄ 45, GeH₄ 40, H₂ 100 | 200 (μW) | 0.015 | 340 |
| p/i anti-diffuse semi layer | SiH₄ 20, GeH₄ 5, H₂ 900 | 50 (RF) | 1.1 | 250 |
| p-semi layer | SiH₄ 100, PH₃/H₂ (1% dil) 500, H₂ 700 | 1000 (RF) | 1.0 | 150 |
| n-semi layer | SiH₄ 100, PH₃/H₂ (1% dil) 500, H₂ 700 | 80 (RF) | 1.0 | 220 |
| i-semi layer | SiH₄ 50, H₂ 200 | 100 (RF) | 1.0 | 250 |
| p-semi layer | SiH₄ 10, BF₃/H₂ (1% dil) 50, H₂ 1000 | 1000 (RF) | 1.0 | 150 |
| Transparent electrode | ITO(In₂ + SnO₂) thin film 100 nm | | | |
| Collector electrode | aluminum (Al) thin film 2 μm | | | |

What is claimed is:

1. A deposit film forming apparatus comprising a temperature control member, for controlling a temperature of a wall of a deposition chamber, in contact with an outer wall of said deposition chamber through a heat conductivity adjusting plate wherein said heat conductivity adjusting plate establishes a temperature difference between said outer wall and said temperature control member, is provided interchangeably, and is treated by a process selected from the group consisting of mirror finish, drilling or knurling.

2. The deposit film forming apparatus according to claim 1, wherein said temperature control member has a flow path of a cooling agent.

3. The deposit film forming apparatus according to claim 1, wherein said temperature control member has a heater.

4. The deposit film forming apparatus according to claim 1, wherein formation of deposit film is carried out by microwave plasma enhanced CVD.

5. The deposit film forming apparatus according to claim 1, wherein said deposition chamber, heat conductivity adjusting plate, and temperature control member are disposed in a vacuum vessel.

6. The deposit film forming apparatus according to claim 1, wherein a deposit film is formed on a beltlike substrate.

7. The deposit film forming apparatus according to claim 1, wherein the processing of said heat conductivity adjusting plate is carried out for varying a contact area with the wall by interchanging said heat conductivity adjusting plate.

8. The apparatus according to claim 1 wherein said heat conductivity adjusting plate is comprised of aluminum or an aluminum alloy.

9. The apparatus according to claim 1, further comprising a heating lamp.

10. The apparatus according to claim 1, further comprising a power supply for controlling film quality.

* * * * *

UNITED STATES PATENT AND TRADEMARK OFFICE
CERTIFICATE OF CORRECTION

PATENT NO.    : 6,113,732
DATED         : September 5, 2000
INVENTOR(S)   : KOHEI YOSHIDA, ET AL.

It is certified that error appears in the above-identified patent and that said Letters Patent is hereby corrected as shown below:

ON THE TITLE PAGE:

Insert: --[*] Notice: This patent issued on a continued prosecution application filed under 37 CFR 1.53(d), and is subject to the twenty year patent term provisions of 35 U.S.C. 154(a)(2).--; and

[56] References Cited, under U.S. PATENT DOCUMENTS

"Kruga" should read --Krogh--.

COLUMN 1:

Line 29, "are." should read --are provided.--.

COLUMN 2:

Line 52, "filled" should read --filled with--.

COLUMN 3:

Line 47, "(Problems" should read --¶(Problems--.

COLUMN 4:

Line 36, "a" should read --also--; and
Line 37, "lso" should be deleted.

UNITED STATES PATENT AND TRADEMARK OFFICE
CERTIFICATE OF CORRECTION

PATENT NO.    : 6,113,732
DATED         : September 5, 2000
INVENTOR(S)   : KOHEI YOSHIDA, ET AL.

Page 2 of 2

It is certified that error appears in the above-identified patent and that said Letters Patent is hereby corrected as shown below:

COLUMN 5:

Line 3, "chamber as" should read --chamber,--.

COLUMN 11:

Line 40, ""dii"" should read --"dil"--.

COLUMN 14:

Line 29, "claim 1" should read --claim 1,--.

Signed and Sealed this

Eighth Day of May, 2001

NICHOLAS P. GODICI

Attest:

Attesting Officer

Acting Director of the United States Patent and Trademark Office